United States Patent
Schremer et al.

(10) Patent No.: US 12,512,312 B1
(45) Date of Patent: Dec. 30, 2025

(54) VERTICAL GALLIUM NITRIDE CONTAINING FIELD EFFECT TRANSISTOR WITH SILICON NITRIDE PASSIVATION AND GATE DIELECTRIC REGIONS

(71) Applicant: POWER INTEGRATIONS, INC., San Jose, CA (US)

(72) Inventors: Alfred T. Schremer, Ithaca, NY (US); Richard J. Brown, Ithaca, NY (US); James R. Shealy, Ithaca, NY (US)

(73) Assignee: POWER INTEGRATIONS, INC., San Jose, CA (US)

( * ) Notice: Subject to any disclaimer, the term of this patent is extended or adjusted under 35 U.S.C. 154(b) by 453 days.

(21) Appl. No.: 18/068,413

(22) Filed: Dec. 19, 2022

Related U.S. Application Data

(60) Provisional application No. 63/293,067, filed on Dec. 22, 2021.

(51) Int. Cl.
| | |
|---|---|
| *H01L 21/02* | (2006.01) |
| *C23C 16/34* | (2006.01) |
| *C30B 25/20* | (2006.01) |
| *H10D 30/01* | (2025.01) |

(Continued)

(52) U.S. Cl.
CPC ........ *H01L 21/0217* (2013.01); *C23C 16/345* (2013.01); *C30B 25/20* (2013.01); *H01L 21/02068* (2013.01); *H01L 21/02167* (2013.01); *H01L 21/02205* (2013.01); *H01L 21/02271* (2013.01); *H01L 21/02389* (2013.01); *H01L 21/0254* (2013.01); *H01L 21/02634* (2013.01);

(Continued)

(58) Field of Classification Search
CPC .......... H01L 21/0217; H01L 21/02068; H01L 21/02167; H01L 21/02205; H01L 21/02271; H01L 21/02389; H01L 21/0254; H10D 30/025; H10D 30/63
See application file for complete search history.

(56) References Cited

U.S. PATENT DOCUMENTS

2013/0341677 A1* 12/2013 Nie .................. H01L 21/02664
257/E27.06

OTHER PUBLICATIONS

M. Eriksson et al., "Hydrogen adsorption states at the Pd/SiO2 interface and simulation of the response of a Pd metal-oxide-semiconductor hydrogen sensor", Journal of Applied Physics 83, 3947-3951 (1998) https://doi.org/10.1063/1.367150.

(Continued)

*Primary Examiner* — Julia Slutsker

(57) ABSTRACT

A Low Pressure Chemical Vapor Deposition (LPCVD) technique is provided to produce improved dielectric/semiconductor interfaces for GaN-based electronic devices. Using the LPCVD technique, superior interfaces are achieved through the use of elevated deposition temperatures (>700° C.), the use of ammonia to stabilize and clean the GaN surface, and chlorine-containing precursors where reactions with chlorine remove unwanted impurities from the dielectric film and its interface with GaN. The LPCVD silicon nitride films have less hydrogen contamination, higher density, lower buffered-HF etch rates, and lower pin hole density than films produced by other deposition techniques making the LPCVD coatings suitable for device passivation. A metal insulator semiconductor (MIS) structures fabricated with LPCVD SiN on GaN exhibit near ideal capacitance-voltage behavior with both charge accumulation, depletion, and inversion regimes.

21 Claims, 25 Drawing Sheets

(51) Int. Cl.
*H10D 30/63* (2025.01)
*H10D 89/00* (2025.01)

(52) U.S. Cl.
CPC .......... *H10D 30/025* (2025.01); *H10D 30/63* (2025.01); *H10D 89/013* (2025.01)

(56) References Cited

OTHER PUBLICATIONS

T. Tsuchiya, "1.01. Silicon and Related Materials. Comprehensive Microsystems". 10.1016/B978-044452190-3.00002-1, (2008) pp. 1-23, Kyoto, Japan.
Z. J. Reitmeier et al., "In situ cleaning of GaN(0001) surfaces in a metalorganic vapor phase epitaxy environment", Journal of Vacuum Science & Technology A 22, 2077-2082 (2004) https://doi.org/10.1116/1.1786309.
Y. Irokawa et al., "Ambient-hydrogen-induced changes in the characteristics of Pt/GaN Schottky diodes fabricated on bulk GaN substrates." Japanese Journal of Applied Physics 60, No. 6 (2021): 068003.
H. Wang et al., "Switching Performance Analysis of Vertical GaN FinFETs: Impact of Interfin Designs," in IEEE Journal of Emerging and Selected Topics in Power Electronics, vol. 9, No. 2, pp. 2235-2246, Apr. 2021, doi: 10.1109/JESTPE.2020.2980445.
A. Stoffel et al., "LPCVD against PECVD for micromechanical applications." Journal of Micromechanics and Microengineering 6 (1996): 1-13.
O. Ylivaara et al., "Aluminum oxide from trimethylaluminum and water by atomic layer deposition: The temperature dependence of residual stress, elastic modulus, hardness and adhesion." Thin Solid Films. 552. 124-135. 10.1016/j.tsf.2013.11.112 (2014).
T. Yamada et al., "Improved interface properties of GaN-based metal-oxide-semiconductor devices with thin Ga-oxide interlayers", Appl. Phys. Lett. 110, 261603 (2017) https://doi.org/10.1063/1.4990689.

* cited by examiner

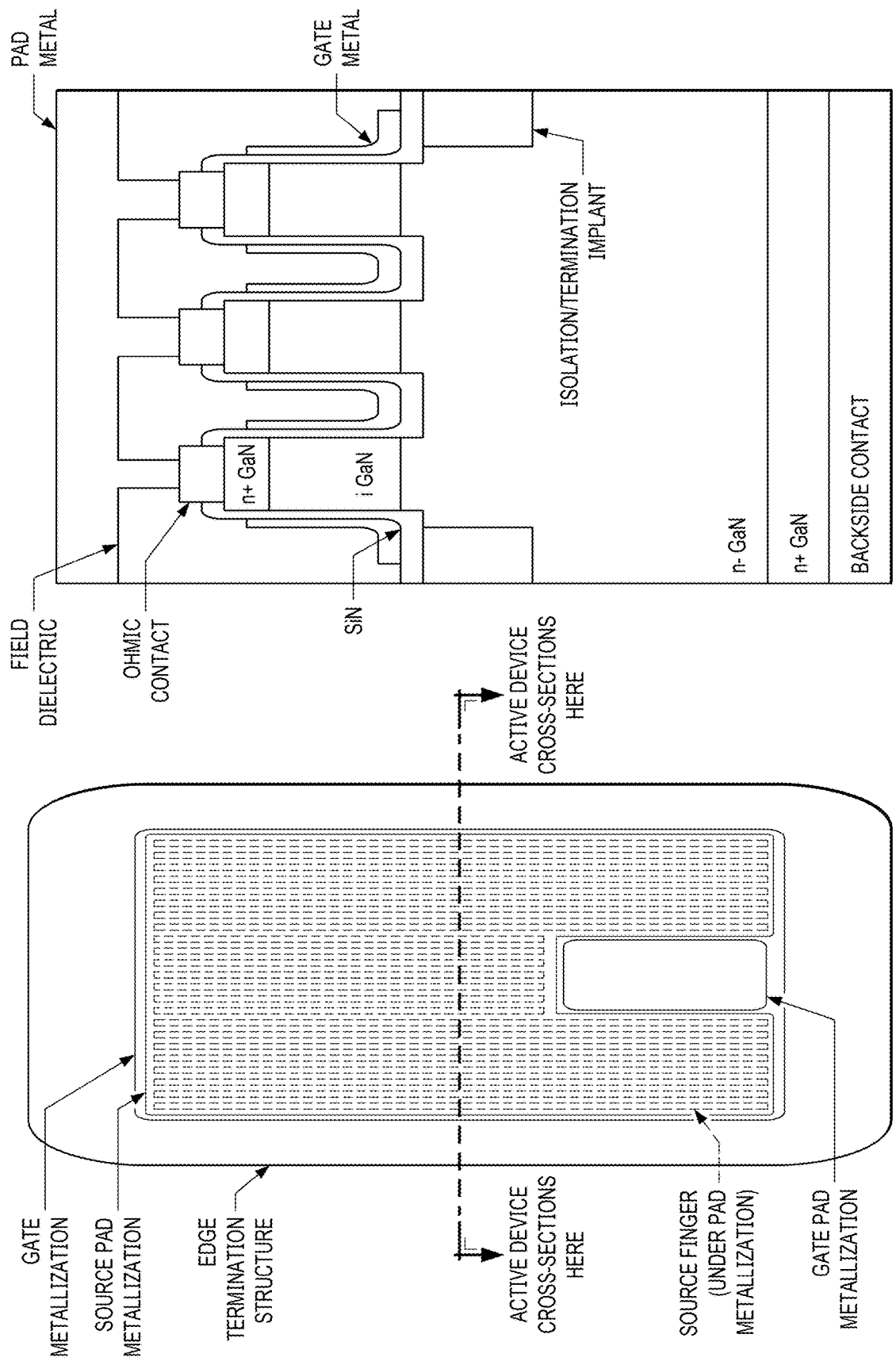

VERTICAL GALLIUM NITRIDE CONTAINING FIELD EFFECT TRANSISTOR WITH SILICON NITRIDE PASSIVATION AND GATE DIELECTRIC REGIONS

This application claims priority to U.S. Application No. 63/293,067, filed on Dec. 22, 2021, which is hereby incorporated by reference in its entirety.

BACKGROUND OF INVENTION

The present invention provides techniques for a high voltage field effect transistor ("FET") configured on a gallium and nitrogen containing material. In an example, the present invention includes a method and resulting structure for a FET configured in a region of gallium and nitrogen containing material, such as GaN or AlGaN. More particularly, the invention provides a method and resulting structure for a high-quality silicon nitride material using low pressure chemical vapor deposition ("LPCVD") techniques for use in passivation and gate dielectric regions. Merely by way of example, the invention has been applied to a high voltage FET device. However, the techniques can be applied other types of device structures and applications.

High voltage switching devices have revolutionized the world. High voltage switches devices are used in all power converters such as those in modern day electric cars, such as the Model S manufactured by Tesla, Inc. Traditional horizontal high voltage device approaches are limited to 600 to 900 Volts. Such horizontal high voltage device approaches are limited by the introduction of defects generated by lattice mismatch of semiconductor materials. The lattice mismatch leads to problems in quality, reliability, and limitations in voltage capability. Other high voltage device approaches such as those grown on bulk crystalline devices are improved. Although many advances occurred in the field of high voltage switching devices, and their processing, various limitations still exist.

From the above, it is seen that techniques for improving electronic devices are highly desirable.

BRIEF SUMMARY OF INVENTION

According to the present invention, techniques for a high voltage field effect transistor ("FET") configured on a gallium and nitrogen containing material are provided. In an example, the present invention includes a method and resulting structure for a FET configured in a region of gallium and nitrogen containing material, such as GaN or AlGaN. More particularly, the invention provides a method and resulting structure for a high-quality silicon nitride material using low pressure chemical vapor deposition ("LPCVD") techniques for use in passivation and gate dielectric regions. Merely by way of example, the invention has been applied to a high voltage FET device. However, the techniques can be applied other types of device structures and applications.

In an example, the present invention provides a high voltage FET using a CVD process for deposition of substantially pure dielectric films on GaN. In an example, substantially pure dielectric films have carbon volume concentrations of less than $10^{18}$ cm$^{-3}$. In an example, the deposition occurs using LPCVD techniques. In an example, the dielectric film can be one of silicon nitride, aluminum silicon nitride, aluminum nitride, silicon oxynitride, gallium oxide, aluminum gallium oxide, magnesium oxide, magnesium silicon nitride, and aluminum oxide, among others.

In an example, various gases can be used as a precursor, such as dichlorosilane is used as the silicon precursor. Ammonia can be used as the nitrogen precursor. Trimethylaluminum can be used as the aluminum precursor. CP$_2$Mg can be used as the magnesium precursor. Nitrous oxide can be used as the oxygen precursor. Silane or disilane can be used as the silicon precursor.

In an example, the process includes an ammonia anneal step of the GaN at temperatures greater than 700° C. but less than a predetermined temperature prior to the initiation of the dielectric deposition.

In an example, the process and resulting structure includes a silicon nitride dielectric deposited on GaN with carbon volume concentrations of less than $10^{18}$ cm$^{-3}$ at the GaN/silicon nitride interface. In an example, the silicon nitride dielectric can be deposited on GaN with oxygen volume concentrations of less than $2 \times 10^{20}$ cm$^{-3}$ at the GaN/silicon nitride interface. The silicon nitride dielectric can be deposited on GaN with oxygen volume concentrations of less than $10^{19}$ cm$^{-3}$ in the silicon nitride film. The silicon nitride dielectric can be deposited on GaN which is annealed in nitrogen or oxygen or mixtures thereof to reduce the hydrogen content of the silicon nitride to less than 1% volume concentration. In an example, which will be further described below, a Metal-Insulator-Semiconductor (MIS) structure can be fabricated with LPCVD using the present high quality dielectrics on GaN.

In an example, the present invention provides a method for fabricating a high power FET device. In an example, the method includes providing a substrate comprising a first side and a second side, the first side comprising an n-type drift material, and overlying intrinsic gallium nitride material, and an n+ type gallium nitride contact material and forming a plurality of fingers comprising an entirety of a thickness of a portion of the n+ type gallium nitride contact material and a portion of the intrinsic gallium nitride material, each of the fingers extending into a predetermined thickness of the n-type drift material such than each of the fingers has a length greater than the entirety of the thickness of the n+ type gallium nitride contract material and the portion of the intrinsic gallium nitride material. In an example, the method includes causing exposure of a portion of the n-type drift material between a pair of the plurality of fingers; and forming a high quality silicon nitride material overlying a surface of each of the plurality of fingers and exposed portions of the n-type drift material between each pair of the plurality of fingers. The method includes exposing a portion of the n+ type gallium and nitride contact material on each of the plurality of fingers and forming a contact region overlying the exposed portion of the n+ type gallium and nitride contact material on each of the plurality of fingers. The method includes forming an insolation region comprising a plurality of implanted species on each side of the plurality of fingers to a predetermined depth to withstand a predetermined voltage and forming a gate metal region between each of the plurality of fingers and along a sidewall of a pair of plurality of fingers. The method includes forming a planarized dielectric material overlying exposed surfaces of the gate metal region, plurality of fingers, isolation region, and contact region and exposing the source contact region and a gate contact region from the gate metal region.

One or more benefits are achieved over pre-existing techniques using the invention. In particular, the invention enables a cost-effective technique for providing improved electrical characteristics of a gallium and nitrogen containing material. In an example, the technique uses a beryllium species configured with implantation techniques into a crystalline gallium and nitrogen containing material to form a low resistivity material for switching devices, among others. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline or can be other configurations. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 1 and 2 are simplified diagrams of a vertical FET device configured on a GaN substrate according to an example of the present invention.

DETAILED DESCRIPTION OF THE EMBODIMENTS

Figure 3:
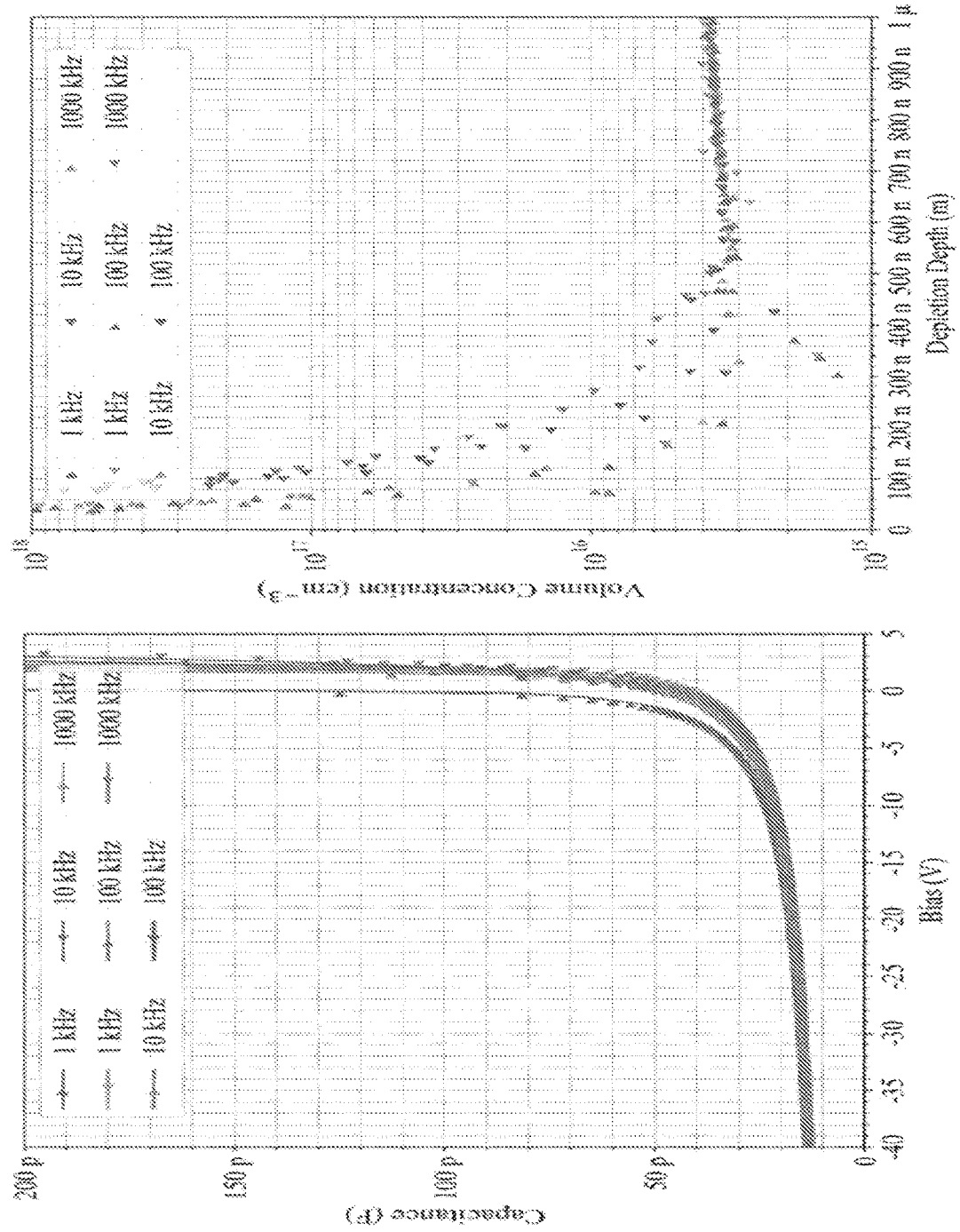
FIG. 3 illustrates data collected using a capacitance voltage technique on a SiN coated low-doped GaN sample according to an example of the present invention.

According to the present invention, techniques for a high voltage field effect transistor ("FET") configured on a gallium and nitrogen containing material are provided. In an example, the present invention includes a method and resulting structure for a FET configured in a region of gallium and nitrogen containing material, such as GaN or AlGaN. More particularly, the invention provides a method and resulting structure for a high-quality silicon nitride material using low pressure chemical vapor deposition ("LPCVD") techniques for use in passivation and gate dielectric regions. Merely by way of example, the invention has been applied to a high voltage FET device. However, the techniques can be applied other types of device structures and applications.

In an example, the present invention provides a structure using a gate configured with the LPCVD nitride material. LPCVD uses a furnace using a chlorine rich environment with di-chlorosilane and ammonia. The chlorine is derived from di-chlorosilane (or mixture of silane or di-silane and chlorine). The gate layer has a thickness ranging from 5 to 50 nm, but can be others.

In an example, the temperature is about 300 Degrees Celsius which is ramped to 500 Celsius. The deposition temperature occurs at 680 Degrees Celsius to about 1100 Celsius. The tool is maintained in a vacuum of using nitrogen and ammonia at a pressure of about 2 Torr, but can range from 50 milli-Torr to 100 Torr. The dichloro-silane is introduced into the chamber, which is heated and sealed. The resulting film has no oxygen, a hydrogen percentage of 1% and less. The silicon nitride Is in an amorphous state or small grains ranging from 10 s of Angstroms.

The silicon nitride Is grown directly on the gallium nitride. In an example, heating the gallium nitride on the ammonia environment is a cleaning process. The cleaning occurs at about 600 Degrees Celsius. The ammonia is used to remove any residual oxygen, carbon, or other species that would create imperfections on the overlying film of silicon nitride. The gallium nitride is on a non-polar face having a surface roughness and is characterized by a threshold voltage and has a low interface charge density, which relates to a shift in threshold voltage. In a preferred embodiment, the interface is substantially free from any hydrogen elements by growing the film high enough to remove any excess hydrogen species. Further details of the present techniques for formation of silicon nitride can be found throughout the present specification and more particularly below.

As shown, is a plan view of the device die (left), and cross section at indicated position (right). As shown, FIG. 1 is a simplified diagram of a vertical FET device configured on a GaN substrate according to an example of the present invention. As shown, FIG. 1 shows both a plan view of the device (left) and a cross sectional view, in the indicated position on the plan view. As also shown, the present invention provides a vertical FET device fabricated in GaN or other suitable material. In an example, the device has a GaN substrate comprising a surface region and a backside region. The device also has an overlying field dielectric material, which is made of silicon nitride or other fill material, which is planarized. The device has an overlying pad metal material, which electrically connects underlying device elements.

In an example, the GaN substrate is n+ type or another type. As shown, the device has an n-type GaN epitaxial layer overlying the surface region. The device has a plurality of finger regions, each of the finger regions having a portion of the n-type GaN epitaxial layer, an n+ type portion, overlying silicon nitride insulating material (which is the gate insulating material), and a contact region electrically coupled to the n+ type portion. In an example, the device has a pair of recessed regions formed between the plurality of finger regions. The device also has gate contact region between each pair of finger regions.

In an example, the device has an n-type GaN channel comprising a doping level and a thickness selected to provide a large gate-drain breakdown voltage in a range from 100 volts to 20 kilo-volts. The device has an n+ type source configured from the n+ type portion of the finger region. The device has a selective area implant region comprising an activated impurity selected from at least one of Be, Mg. Zn, Ca, and Cd configured from a bottom portion of the recessed regions and configured to be substantially free from ion implant damage using an annealing process. The device has a p-type gate region configured from the selective area implant region. The device has a depth characterizing each of the recessed regions configured to provide physical separation between the n+ type source region and the p-type gate region such that a low reverse leakage gate-source p-n junction is achieved. The device has an extended drain region configured from a portion of n-type GaN region underlying the recessed regions. The device has an n+ GaN region formed by epitaxial growth directly overlying the backside region of the GaN substrate and a backside drain contact region configured from the n+ type GaN region overlying the backside region.

In an example, the n+ source region or regions are provided by a donor impurity ion implantation and a subsequent annealing process. In an example, the source region or regions are provided with silicon as a donor impurity. In an example, the channel region or regions are provided with a silicon as a donor impurity. In an example, the device has a dielectric spacer layer deposited conformally overlying the recessed regions to limit a lateral penetration of a subsequent ion implant of acceptors into the n-type GaN channel. In an example, the device has a dielectric spacer layer deposited conformally overlying the recessed regions to encapsulate and passivate a plurality of GaN exposed surfaces between the n+ type source and the p-type gate region.

In an example, the device has a trench region configured around a periphery of a device region, the trench region comprising a dielectric fill material and configured to form an isolation region. In an example, the dielectric fill material is at least one of SiN, a mixed dielectric AlSiN, or AlN.

In an example, the device has a built-in voltage of a gate-source diode is approximately 3 volts or higher to achieve a wider channel width as compared to a metal-insulator-semiconductor gate structure for a normally-off enhancement mode device.

In a preferred example referring again to FIG. 1, the device has one or more of the following structural elements.

Substrate:
1. Substrate is a conducting bulk GaN substrate

Epitaxy:
1. The first layer of epitaxy (going up from the substrate) is made of a thick (~10-75 μm) drift layer with a net donor doping level of 1e15 atoms/cm$^{-3}$-5e16 atoms/cm$^{-3}$.
   In an example, the first layer is grown by MOCVD (Metal Organic Chemical Vapor Deposition).
   In an alternative example, the first layer is grown by HVPE (Hydride Vapor Phase Epitaxy).
2. The second layer of epitaxy is made of a thin (0.25-2 μm) intrinsic GaN layer.
   In an example, the layer has no intentional net doping concentration.
   In an example, the layer has an extremely low level of unintentional dopants or impurities or utilizes compensation doping to provide a near-net-zero level of doping having a predetermined concentration level or range.
3. The third layer is a heavily doped n+ contact layer with a doping range of 5e17 atoms/cm$^{-3}$-1e20 atoms cm$^{-3}$ of impurities.

Contacts:
1. The top ohmic contact is made of a Ti-based multilayer deposited via evaporation or sputtering.
2. The bottom ohmic contact is made of a Ti-based multilayer deposited via evaporation or sputtering and is placed after the substrate is thinned to less than 100 μm thickness.

Dielectrics:
1. The thick field dielectric is made of either silicon nitride or silicon dioxide deposited by plasma enhanced chemical vapor deposition (PECVD).
   The thick field dielectric is conformal and planarized.
2. The gate dielectric is made of silicon nitride deposited via low pressure chemical vapor deposition (LPCVD).

Termination:
1. Field management edge termination, comprised of either, or a combination of:
   Junction termination extension formed by ion implant/activation
   Floating guard rings formed by ion implant/activation
   Deep etch the full thickness of drift layer Operation Example 1. Current flow from drain to source is controlled by the bias on the gate terminal.
2. The doping in the second epi layer is low enough or compensated enough such that the work function differential of the gate metal and GaN through the metal-insulator-semiconductor (MIS) interface creates a depletion region that is wider than the fin itself, thus pinching off current flow in the device at zero bias. A positive bias must be put on the gate terminal relative to the source to create an accumulation layer at the MIS interface of the second epi layer. This allows current to flow through this layer, turning the device on.
3. The choice of dielectric material to form the MIS interface of is utmost importance. The material must make a high-quality interface with the GaN, and the response of the formation of the accumulation layer must not have hysteresis with applied gate bias. For these reasons, low pressure chemical vapor (LPCVD) deposited silicon nitride (SiN) has been selected for this layer.

Experimental Evidence of the Formation of Accumulation Layers at the GaN/SiN Interface with Little to No Hysteresis:

FIG. 3 illustrates data collected using a capacitance voltage technique on a SiN coated low-doped GaN sample. As shown, the arrows on the curves indicate direction of voltage sweep (positive-to-negative, or negative-to-positive).

Capacitance-Voltage data (left) shows that there is little to no hysteresis except for measurements at very low frequency (1 kHz). From this data, the volume concentration of electrons can be calculated in the GaN and plotted vs. depth into the GaN. Data shows formation of a very strong inversion layer at the GaN/SiN interface. This strong inversion layer is what forms the conduction channel in the transistor.

Further details of techniques including a method of fabricating the device can be found throughout the present specification and more particularly below.

A method according to an example of the present invention is briefly provided below.

1. Provide a substrate comprising a first side and a second side, the first side comprising an n-type drift material, and overlying intrinsic gallium nitride material, and an n+ type gallium nitride contact material;
2. Form a plurality of fingers comprising an entirety of a thickness of a portion of the n+ type gallium nitride contact material and a portion of the intrinsic gallium nitride material, each of the fingers extending into a predetermined thickness of the n-type drift material such than each of the fingers has a length greater than the entirety of the thickness of the n+ type gallium nitride contract material and the portion of the intrinsic gallium nitride material;
3. Cause exposure of a portion of the n-type drift material between a pair of the plurality of fingers;
4. Form a high quality silicon nitride material overlying a surface of each of the plurality of fingers and exposed portions of the n-type drift material between each pair of the plurality of fingers;

5. Expose a portion of the n+ type gallium and nitride contact material on each of the plurality of fingers and forming a contact region overlying the exposed portion of the n+ type gallium and nitride contact material on each of the plurality of fingers;
6. Form an insolation region comprising a plurality of implanted species on each side of the plurality of fingers to a predetermined depth to withstand a predetermined voltage;
7. Form a gate metal region between each of the plurality of fingers and along a sidewall of a pair of plurality of fingers;
8. Form a planarized dielectric material overlying exposed surfaces of the gate metal region, plurality of fingers, isolation region, and contact region;
9. Expose the source contact region and a gate contact region from the gate metal region; and
10. Perform other steps, as desired.

The above sequence of steps is used to form high voltage FET devices on a die from a substrate structure according to one or more embodiments of the present invention. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below.

Process Flow

Figure 4:
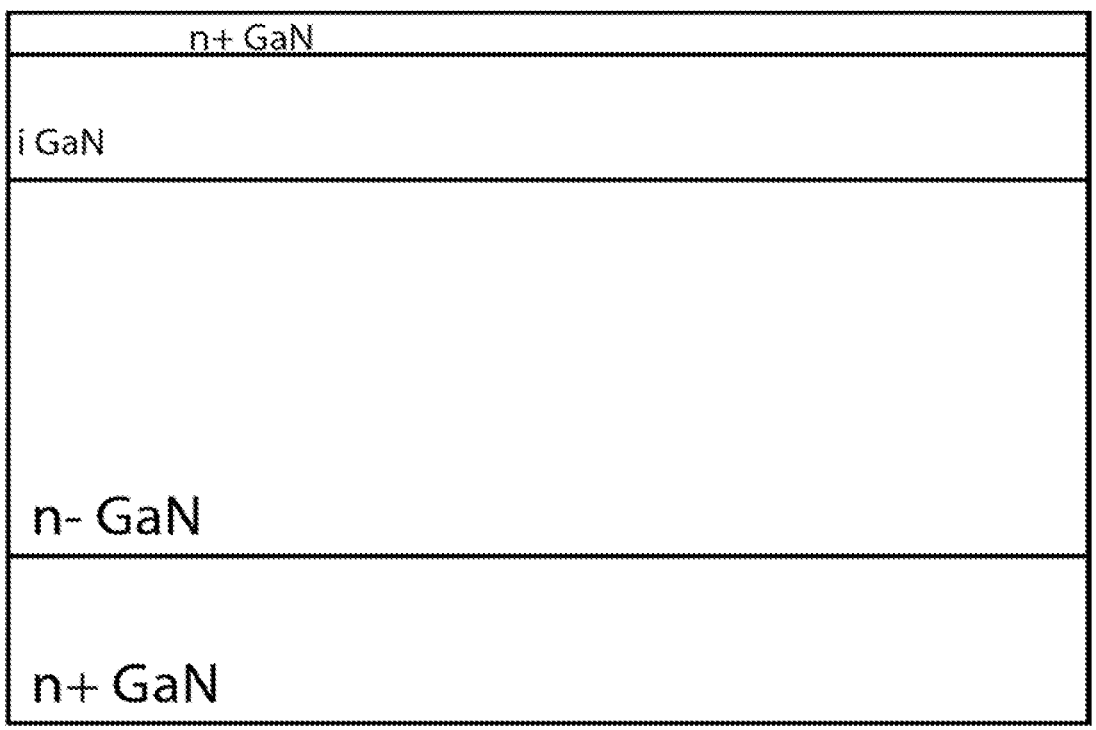
FIGS. 4 to 12 illustrate a method of fabricating the vertical FET device according to an example of the present invention.
Figure 5:
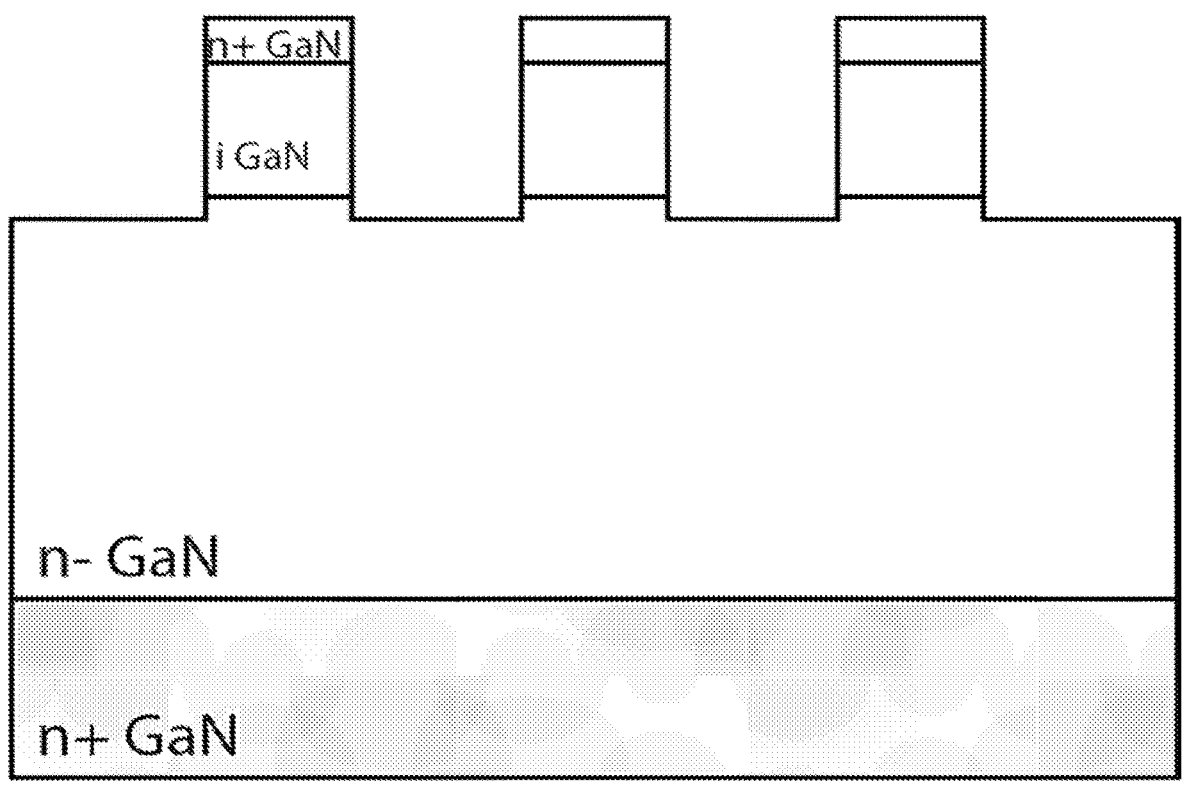
Figure 6:
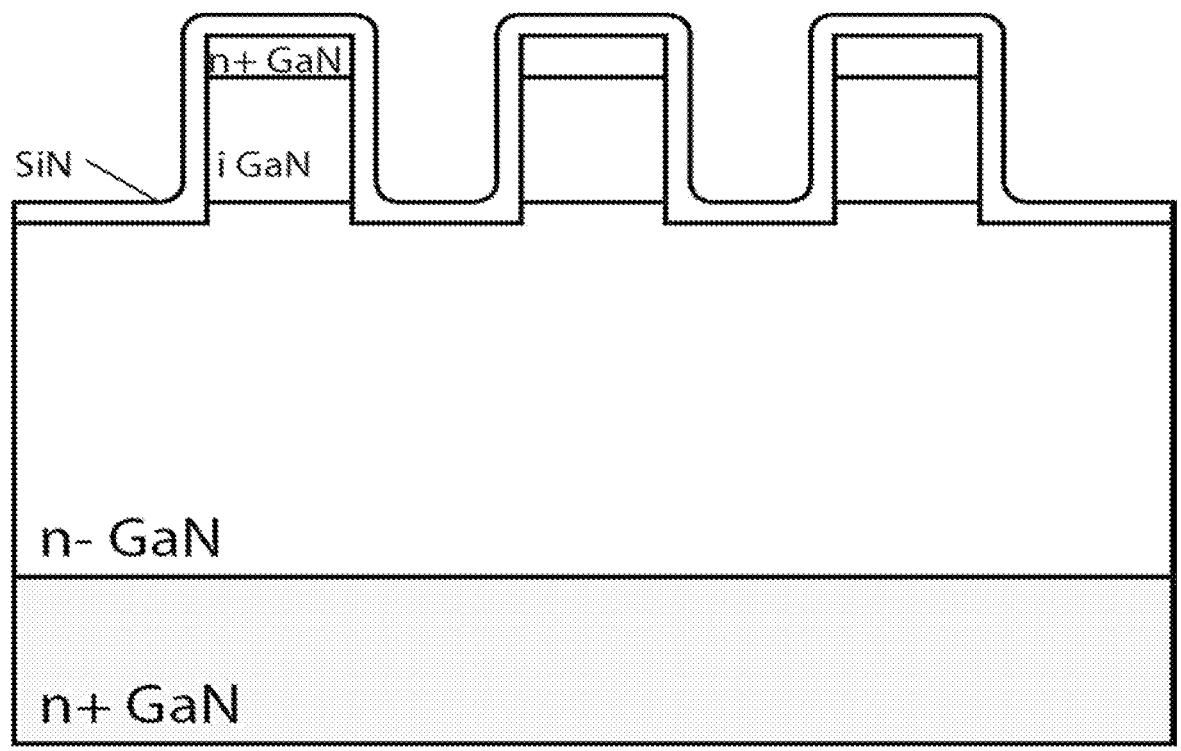
Figure 7:
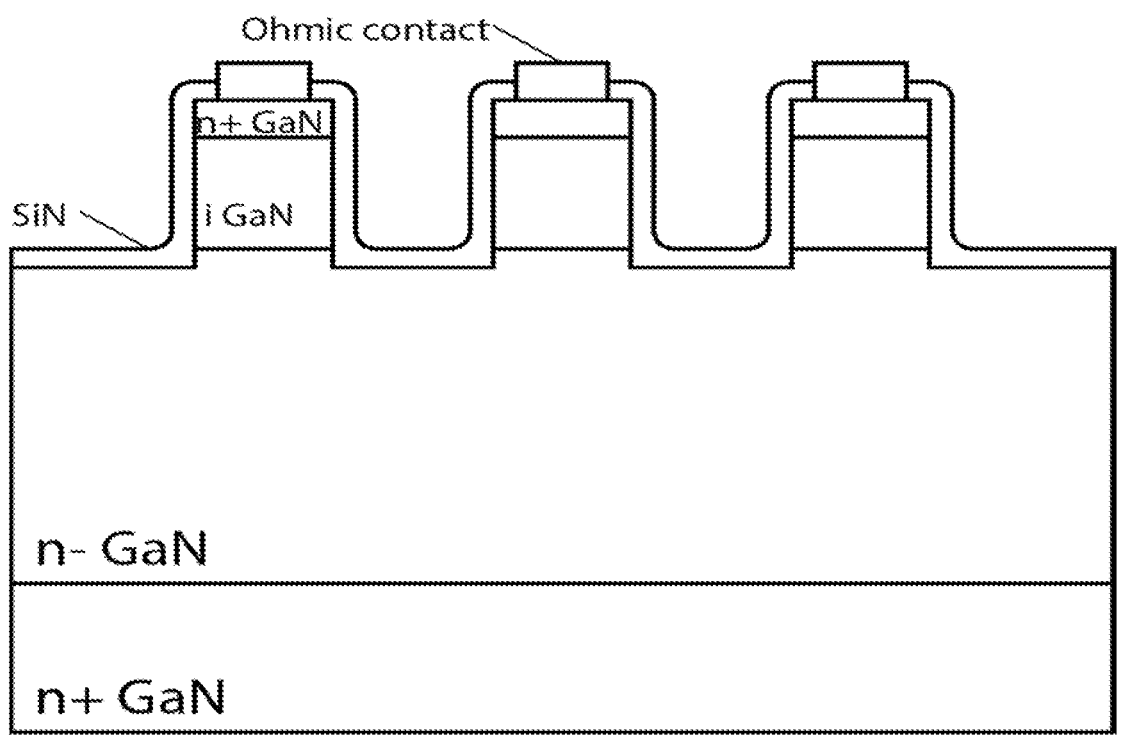
Figure 8:
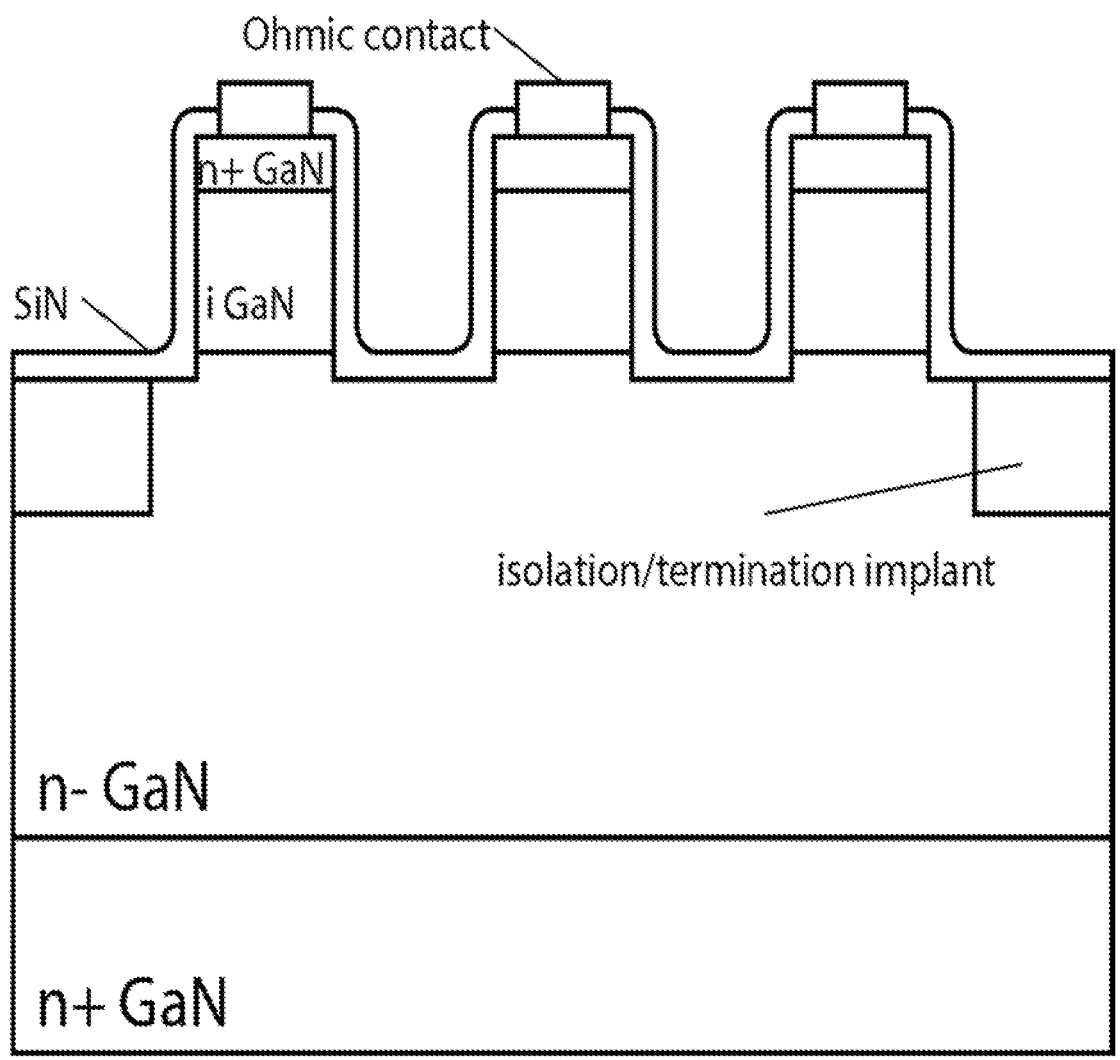
Figure 9:
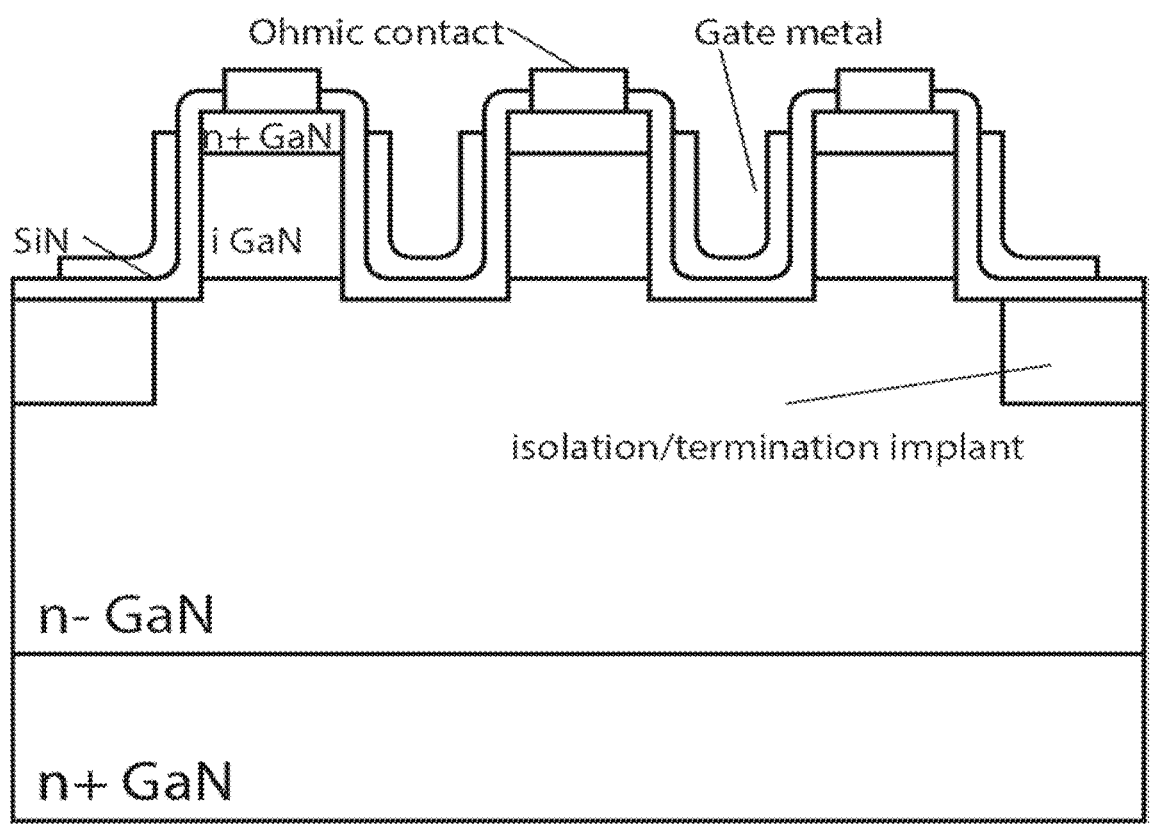
Figure 10:
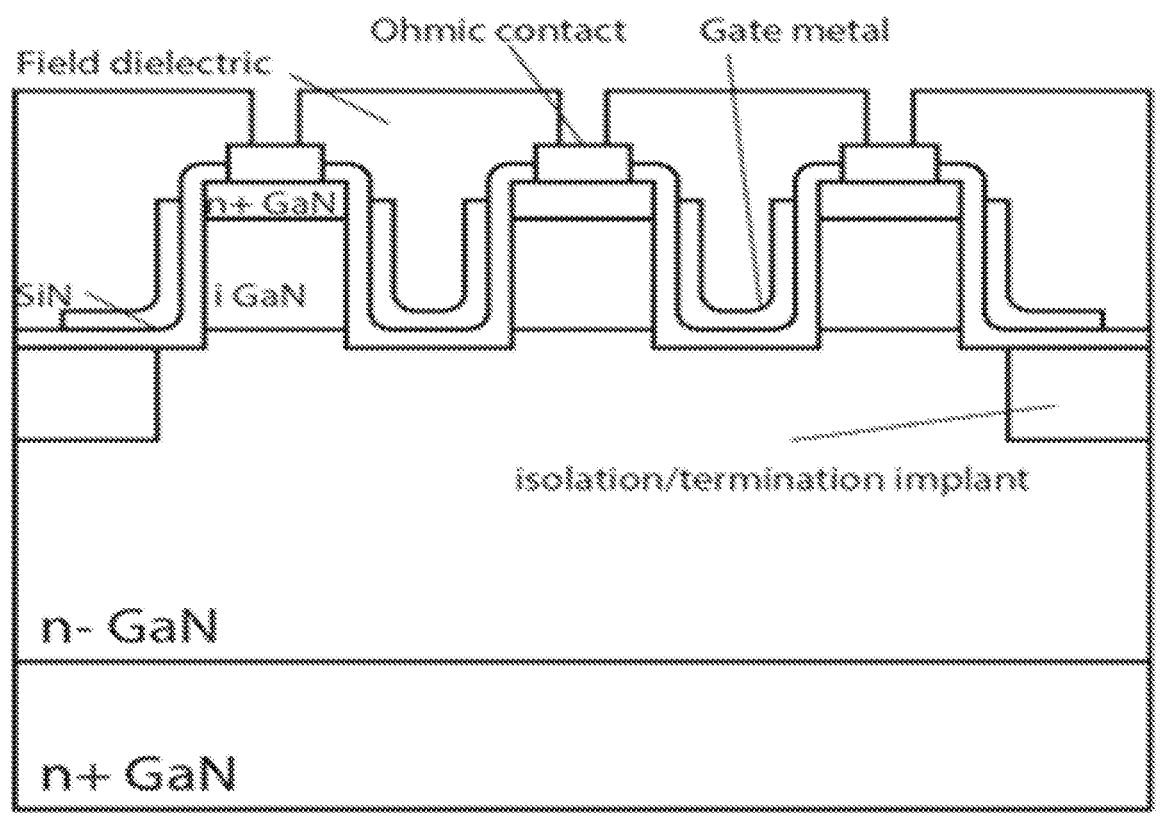
Figure 11:
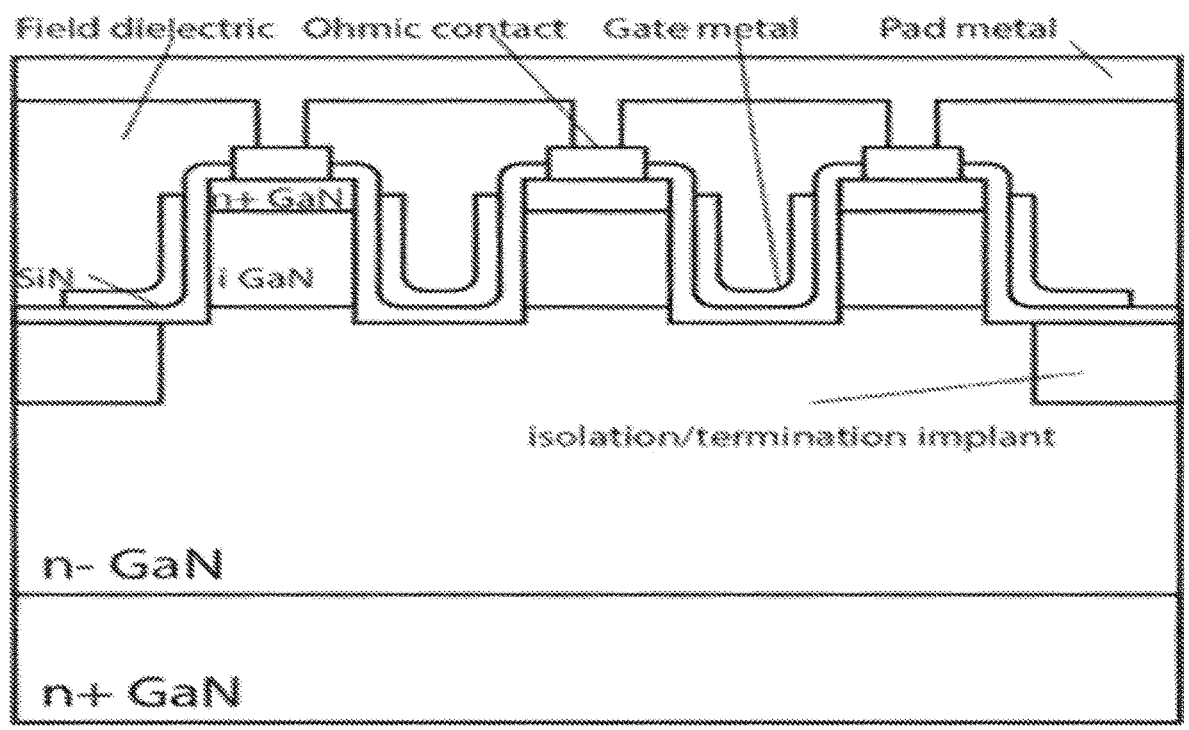
Figure 12:
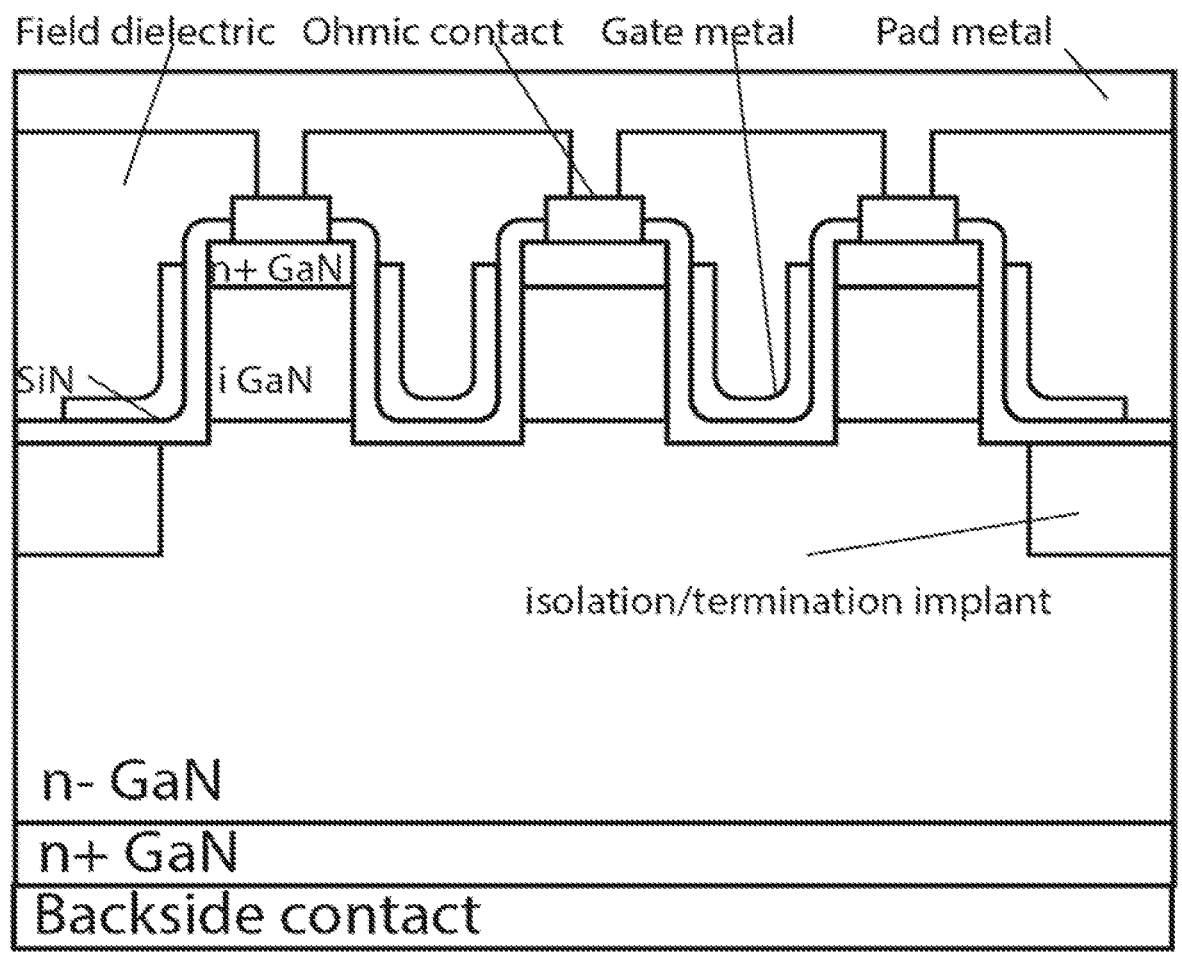

1.) Starting structure: epitaxy on substrate (epi typically GaN, substrate can be anything), see FIG. 4.
   1. N-drift layer
   2. Intrinsic, or compensated GaN layer
   3. N+ contact layer
2.) Plurality of fins (or fingers) etched into surface to a depth slightly greater than the intrinsic GaN layer, see FIG. 5.
3.) High-quality low pressure chemical vapor deposited SiN applied as gate dielectric, see FIG. 6.
4.) A Ti/Al based ohmic contact is applied to the top of the n+ layer of the fins by first etching through the SiN and lifting off the ohmic contact metal. The ohmic contact metal is then annealed in a controlled ambient to sinter the contact, see FIG. 7.
5.) Isolation/termination implant is performed to make an insulating region in the GaN, see FIG. 8.
6.) Gate metal is lifted off at an angle to coat sidewalls to overlap the n+ region, see FIG. 9 below, see FIG. 9.
7.) A thick field oxide is deposited by PECVD and vias etched to the source contact and the gate contact pad, see FIG. 10.
8.) A source pad is lifted off and comprised of a highly conducting metal such as Al, Cu, Au, or combinations thereof, see FIG. 11.
9.) The n+ GaN substrate is thinned down to 25 to 100 μm. The substrate surface is then cleaned and chemically treated and an ohmic contact applied. Low temperature <600° C. annealing for short times may be used to form the contact after metal application. Devices can be singulated and packaged at this point, see FIG. 12.

As shown the high voltage switching device is configured from a drain region configured from the backside region of the gallium and nitrogen containing substrate member, a gate region configured from connection to each of the p-type metal contact regions, a channel region configured between a pair of p-type regions, and a source region configured from connection to each of the n-type contact metals. Further details of a silicon nitride deposition technique and related structure can be found below.

Present Examples of LPCVD Silicon Nitride

Dielectric coatings are commonly used to form MIS capacitors on semiconductors and to form insulating passivation coatings. Ideally, the dielectric material is impurity free and stochiometric to realize high dielectric breakdown strength and low parasitic leakage currents. For GaN-based electronics the dielectric films are most commonly deposited by Plasma Enhanced Chemical Vapor Deposition (PECVD) and Atomic Layer Depostion (ALD). These films are typically deposited at low temperatures (<350° C.) without any in-situ cleaning step to remove contaminates from the semiconductor surface. As a result large amounts of carbon (and oxygen) are present at the dielectric insulator/semiconductor interface. In addition, large densities of pin holes, hydrogen and carbon contamination, and trace metallic impurities are also present in the dielectric with these low deposition temperature techniques [Stoffel 1996].

In an example, the LPCVD technique is a common tool used for dielectric deposition in silicon-based fabrication recipes [Tsuchiya 2008]. It is typically a high temperature process and it can be used on compound semiconductors if the semiconductor surface is stabilized with a group V precursor prior to deposition. For the GaN semiconductor in the LPCVD process, ammonia gas is introduced at an elevated substrate temperature prior to initiation of the dielectric deposition. If the GaN surface temperature is sufficiently high (>700° C.), the anneal in ammonia gas is known to clean the GaN surface of carbon and oxygen containing contaminants [Reitmeier 2004]. This ammonia anneal is universally used prior to epitaxial deposition using the MOCVD technique. This first step in the LPCVD process is responsible for the reduction (if not the elimination) of carbon and oxygen impurities at the insulator-semiconductor interface. The SiN deposition is initiated in the LPCVD process after the ammonia anneal by the introduction of the silicon precursor into the reaction cell. In a preferred embodiment of the invention, the silicon precursor contains chlorine (DCS or dichlorosilane for example) or a silicon precursor without chlorine (silane or disilane for example) is mixed with a chlorine precursor (HCl gas for example) such that large concentrations of chlorine are present during the growth of the SiN dielectric film. The chlorine present reacts with any trace metallic impurities which then are removed as a volatile product. These reactions with chlorine during the deposition greatly enhance the purity of the deposited SiN film by the removal of trace metallic impurities.

Figure 13A:
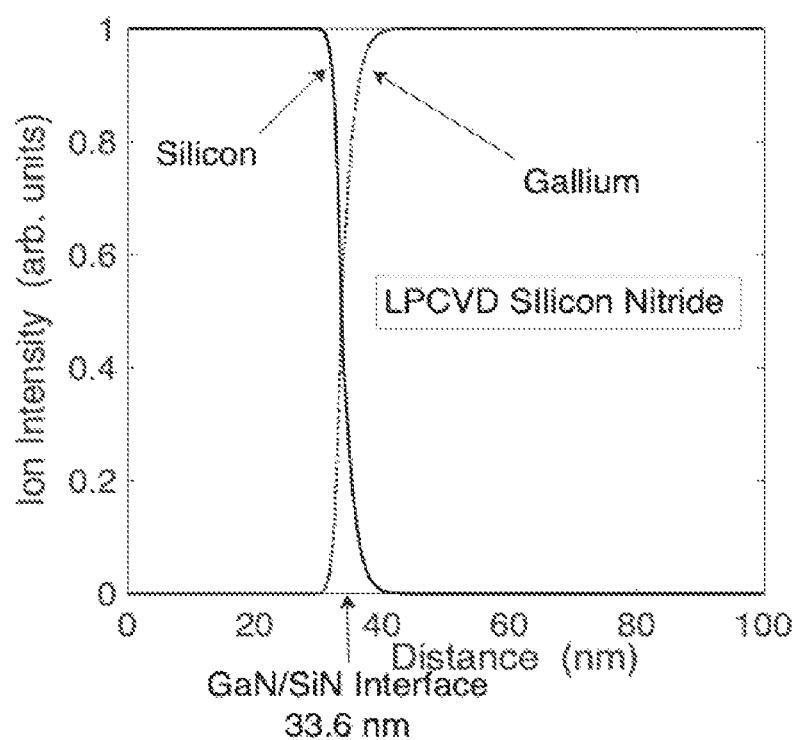
FIGS. 13A to 19 illustrate experimental results according to examples of the present invention.
Figure 13B:
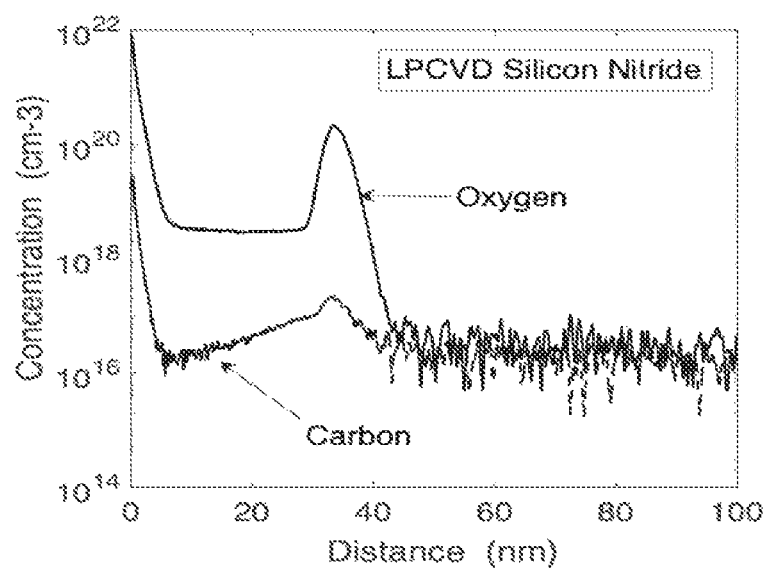
Figure 13C:
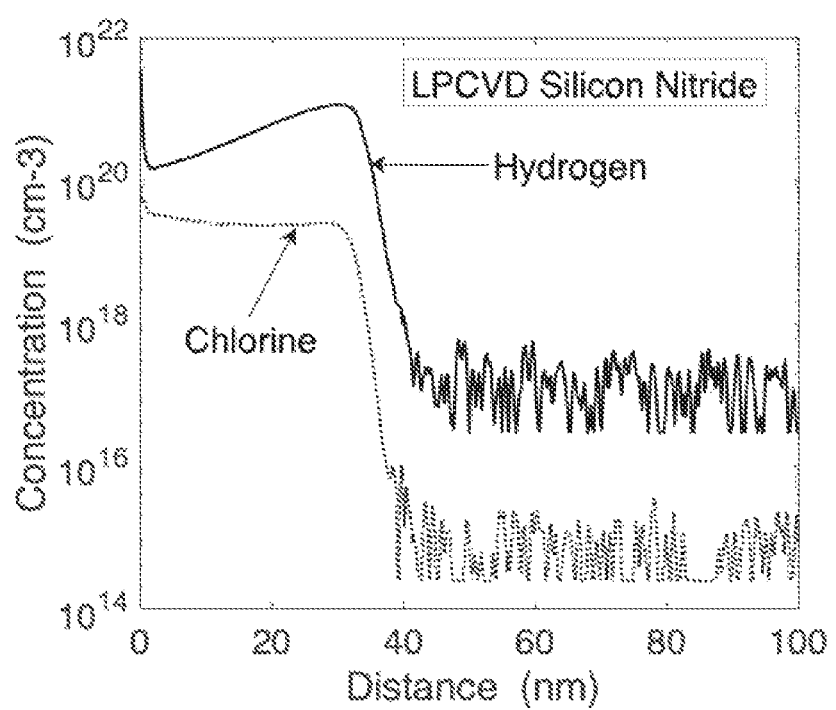

In FIGS. 13A, B, C, the residual impurities are profiled in the LPCVD deposited SiN on GaN using the Secondary Ion Mass Spectroscopy (SIMS) technique. The LPCVD process was carried out at a GaN substrate temperature of 750° C. using dichlorosilane (DCS) and ammonia. The stochiometric $Si_3N_4$ film thick was 30 nm. For this typical sample, the carbon volume concentration at the interface was less than $2 \, (10^{17}) \, cm^{-3}$. The carbon concentration in the dielectric is roughly in the mid to low $10^{16} \, cm^{-3}$. The oxygen volume concentration at the interface was roughly $2 \, (10^{20}) \, cm^{-3}$. The chlorine and hydrogen remain in the SiN film at low concentrations less than 0.5% and 1%, respectively. It should be noted that these concentrations (chlorine and hydrogen) can be dramatically reduced by post growth annealing in nitrogen gas.

As shown, FIGS. 13A, B, C illustrates SIMS profile of elements present in the SiN/GaN structure produced by LPCVD with DCS and ammonia.

Figure 14A:
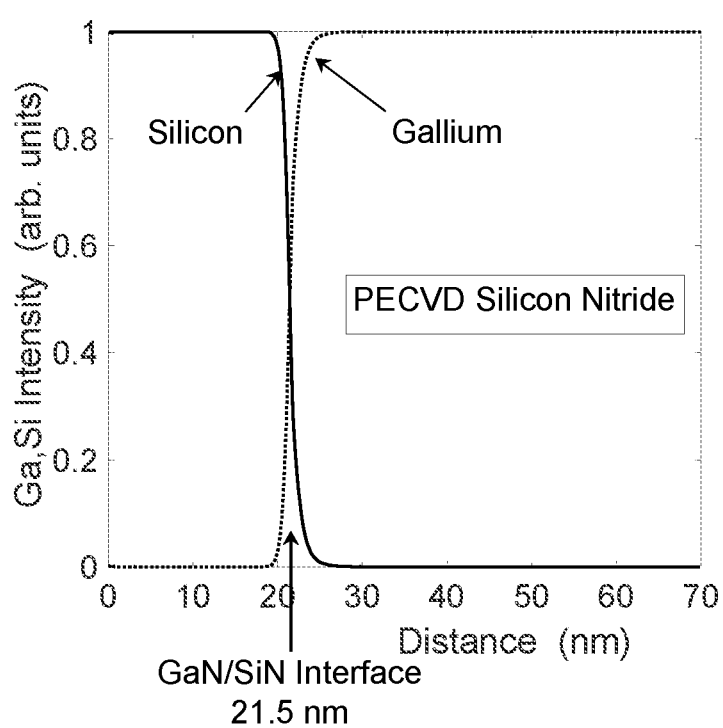
Figure 14B:
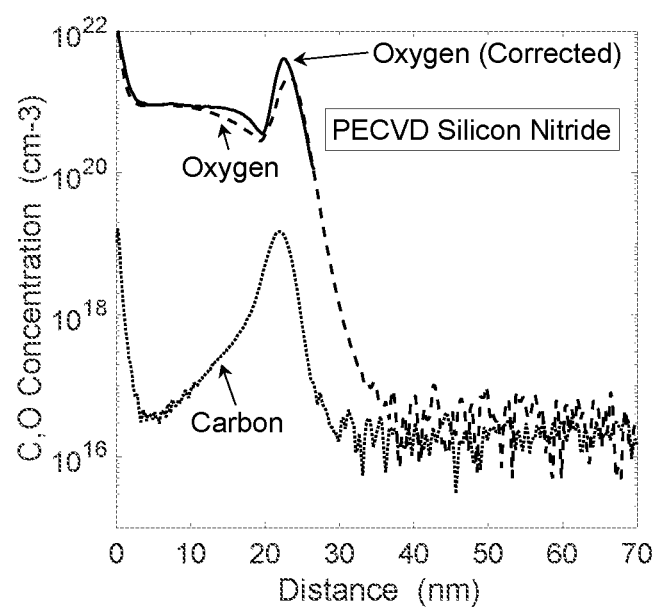
Figure 14C:
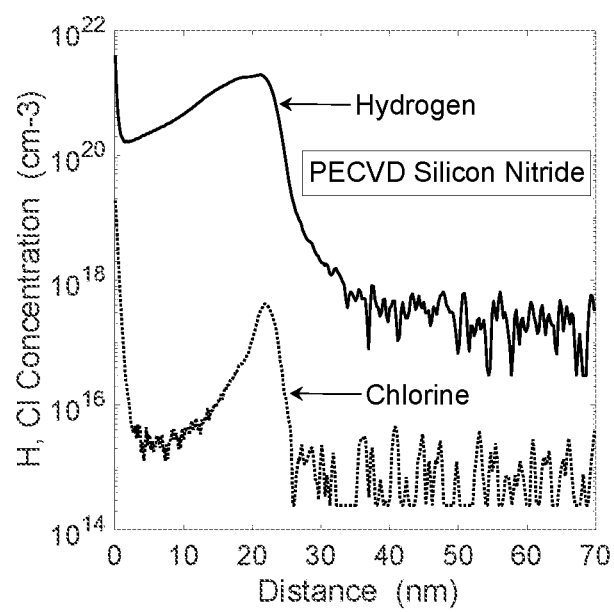

For comparison, the dominant residual impurity profiles in a PECVD SiN film on GaN are profiled using SIMS in FIGS. 14A, B, C. The PECVD was carried out at a GaN substrate temperature of 350° C. with silane and ammonia sources. The nominal thickness was 30 nm. For the low temperature PECVD SiN, the volume concentration of carbon trapped at the interface was roughly $2(10^{19})$ cm$^{-3}$. This represents a two order of magnitude (100×) increase in carbon at the interface compared to the LPCVD SiN on GaN structure. Thew carbon concentration in the dielectric film was roughly at the $10^{17}$ cm$^{-3}$ level, ten times that of the LPCVD SiN film. The oxygen volume concentration at the interface was roughly $4(10^{21})$ cm$^{-3}$, a factor of 20 higher than the LPCVD SiN on GaN structure. The room temperature wet chemistry used to prepare the GaN sample for the SiN coating comprised of an aqueous HCL solution. This pre-treatment results in a small amount of chlorine [volume concentration of $4(10^{17})$ cm$^{-3}$] trapped at the interface in the PECVD sample. The PECVD SiN film was also contaminated with oxygen throughout its thickness with a volume concentration of roughly 10%, more than 2 orders of magnitude greater than the LPCVD SiN film. The source of oxygen in the PECVD process is believed to be atmospheric contamination of the process chamber during loading. Finally, it is worth noting that the hydrogen content of the PECVD SiN was a factor of 2 higher than the LPCVD SIN. This data clearly shows the improved quality of these MIS structures using the LPCVD technique.

As shown, FIGS. 14A, B, C illustrates SIMS profile of elements present in the SiN/GaN structure produced by PECVD with silane and ammonia.

The Atomic Layer Deposition (ALD) process has been applied to the deposition of aluminum oxide [Ylivaara 2014]. MIS structures using this process have been applied to the formation of gate structures in GaN transistors [Wang 2020]. For comparison against the LPCVD process, MIS structures on GaN have been fabricated using the ALD technique with aluminum oxide ($Al_2O_3$) as the insulator. The GaN substrate was heated to 200° C. and subsequentially exposed to 256 cycles of Trimethylaluminum (TMA) exposure yielding a 30 nm thick film. The dominant residual impurities in these dielectric films and the impurities trapped at the interface with GaN were examined with the SIMS technique. FIG. 15 gives a depth profile of these impurities in the ALD prepared $Al_2O_3$ on GaN sample. For this typical sample, the carbon volume concentration at the interface was roughly $2(10^{19})$ cm$^{-3}$, comparable to the PECVD technique and one hundred times that of LPCVD. The carbon volume concentration in the dielectric film was roughly $10^{19}$ cm$^{-3}$, clearly indicating the lack of purity achieved in the ALD process. The $Al_2O_3$ film also contains roughly 10 to 20% hydrogen. The room temperature wet chemistry used to prepare the GaN sample for the ALD coating comprised of an aqueous HCL solution. This pre-treatment results in a noticeable amount of chlorine [volume concentration of $4(10^{18})$ cm$^{-3}$] trapped at the interface in the ALD sample. This is roughly ten times larger than the chlorine observed in the PECVD sample, likely larger because the deposition temperature is significantly lower with ALD resulting in less chlorine desorption prior to deposition.

Figure 15A:
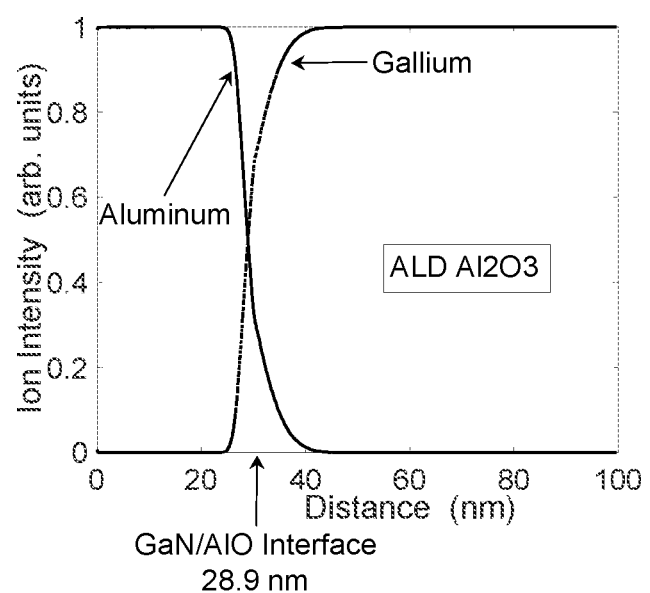
Figure 15B:
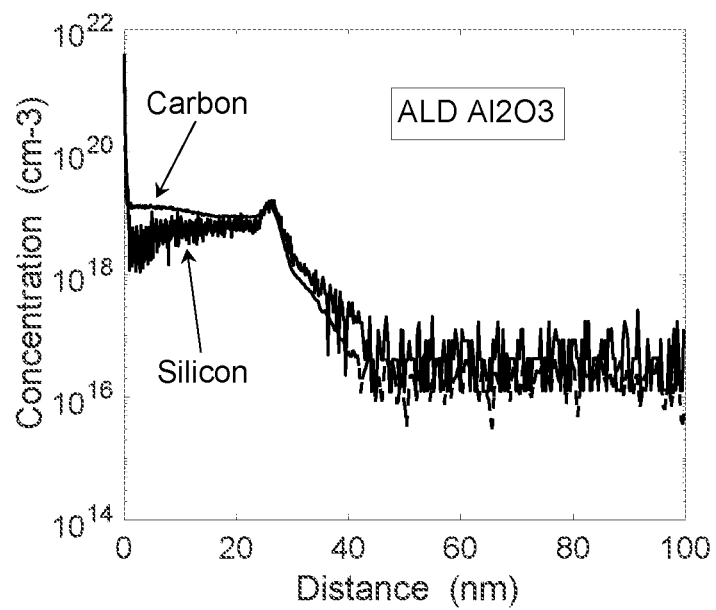
Figure 15C:
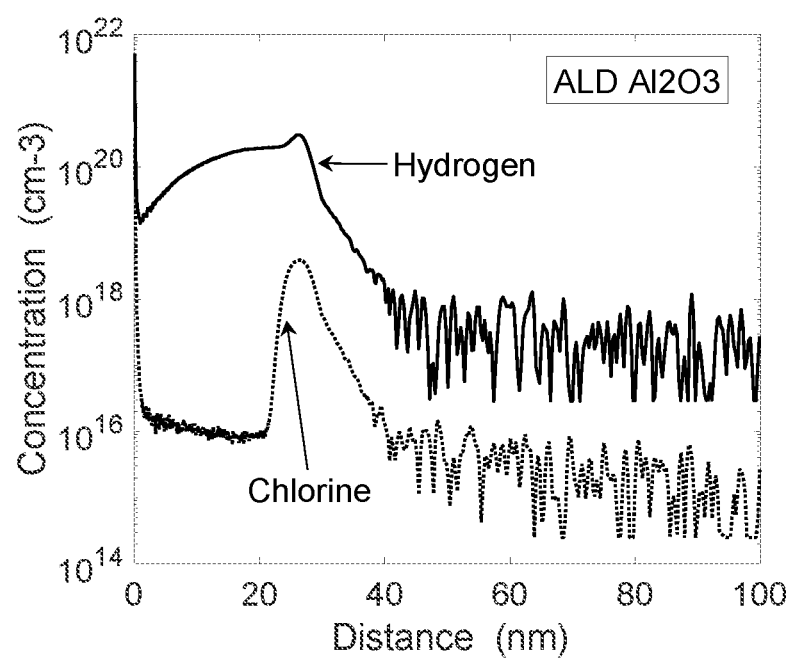

As shown, FIGS. 15A, B, C illustrates SIMS profile of elements present in the $Al_2O_3$/GaN structure produced by ALD with TMA.

Figure 16:
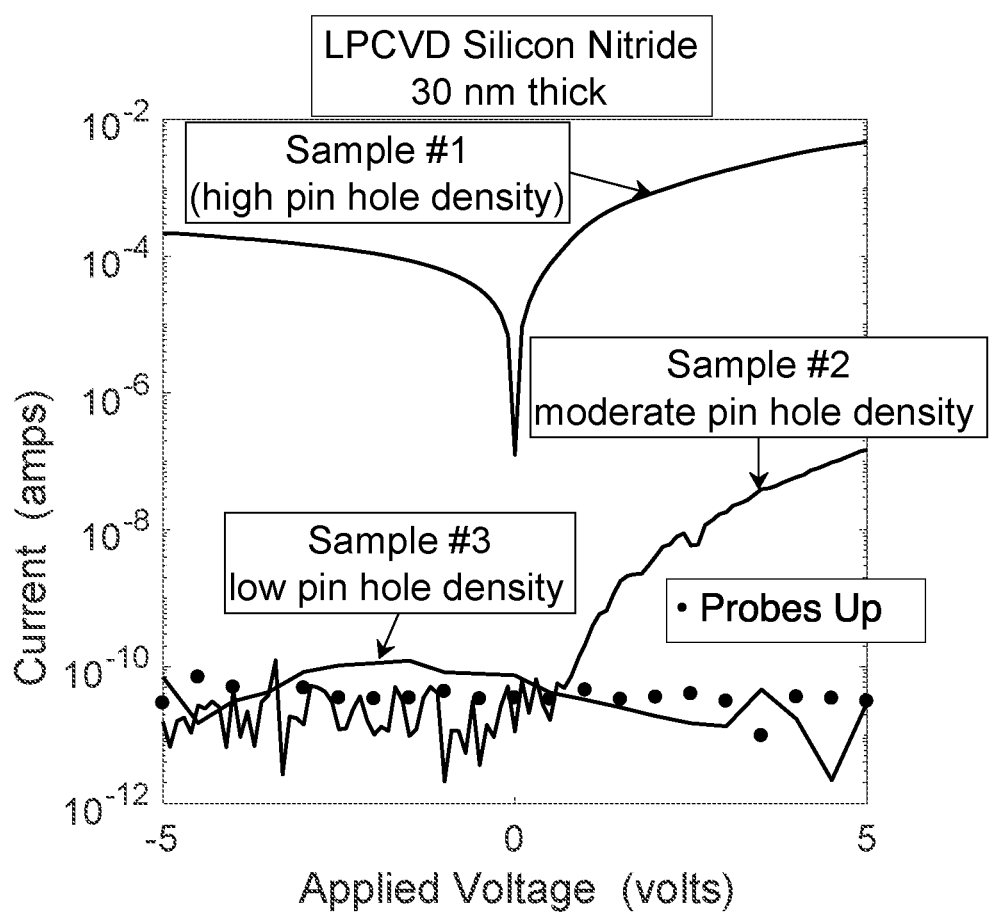

In forming the MIS structures for semiconductor device applications, the reduction of the pin hole density, and the corresponding shunt conduction paths that pin holes introduce, are key metrics for a good quality dielectric film. For each pin hole penetrating the entire dielectric film, a Schottky Barrier diode of small area is introduced. A small bias dependent leakage current will then be present with any MIS structure with pinholes present. To compare pinhole densities using the three deposition techniques, current-voltage curves are measured on probed MIS structures. If no pinholes are present then the current measured is the measurement floor of the instrumentation used which was 50 pA. This measured current was also observed when the small area Schottky diode corresponding to the pinhole was reversed biased. Applying a forward bias greater than the Schottky diode turn on voltage (approximately 1 volt) to a sample with pinholes results in measured currents of greater than 100 pA. FIG. 16 illustrates the current-voltage behavior of a MIS structure fabricated with the LPCVD method which has pinhole densities present. As shown, FIG. 16 illustrates Current-Voltage Curves measured with probes removed from sample and applied to a LPCVD MIS samples of 1 mm diameter with varying degrees of pin holes present.

The measurement floor was determined with the probes up (removed from sample) and the IV curve was measured in forward and reverse bias. The resulting current was roughly 50 pA and independent of applied bias voltage. When a LPCVD sample with pinholes was probed a shunt conduction appears for bias voltages greater than roughly 1 volt as shown in FIG. 16. Greater pinhole densities produce larger measured currents at forward biases greater than 1 volt along with a noticeable increase in reverse leakage currents. With the three deposition techniques examined with IV curves the density of pinholes can be compared. An array of metal contacts of different area are applied to the surface of the dielectric coating of each sample. When asymmetric IV curves are observed (rectification), the MIS sample is determined to have pinholes present. Table 1 below gives the results comparing pinholes with the 3 deposition techniques. The larger the metal contact area the more likely that pinholes will alter the IV curves producing rectification. With the LPCVD process, contact areas up to $2(10^{-3})$ cm$^2$ produce no leakage currents associated with pinholes. With the PECVD and ALD deposition techniques contact areas of $10^{-3}$ cm$^2$ reveal pinholes on 25% of the MIS structures tested. Increasing the area by a factor of 2, doubles the number of contacts with pinholes with PECVD and ALD used. From a pinhole perspective as well as a leakage current perspective, it is seen that the LPCVD films are superior to those produced by the PECVD and ALD methods.

The ability for a dielectric film to provide a moisture barrier is governed by the pinhole density. Accordingly, the LPCVD method is expected to provide a superior passivation or encapsulant for the GaN polar semiconductor. The LPCVD film is expected to produce the most robust and stable MIS gate contact to field effect transistors. In separate experiments the LPCVD film of 30 nm thickness was determined to prevent the oxidation of GaN in steam for 1 hour at 1000° C.

TABLE 1

Comparison of pinhole densities on contacts of different area
with LPCVD, PECVD and ALD deposited dielectric films.
Percentage of Contacts with Pinholes
Film thickness—30 nm

| Contact Area (cm$^2$) | LPCVD Si$_3$N$_4$ | PECVD Si$_3$N$_4$ | ALD Al$_2$O$_3$ |
|---|---|---|---|
| 0.001 | 0 | 25% | 25% |
| 0.002 | 0 | 50% | 100% |
| 0.004 | 50% | 75% | 100% |

Figure 17:
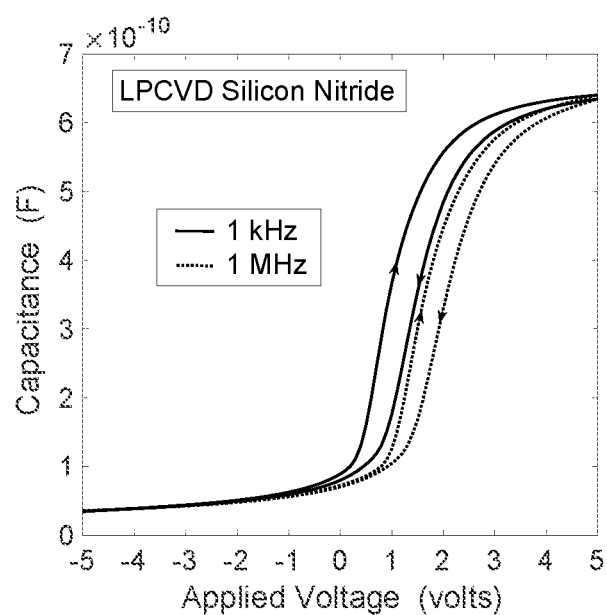
Figure 18:
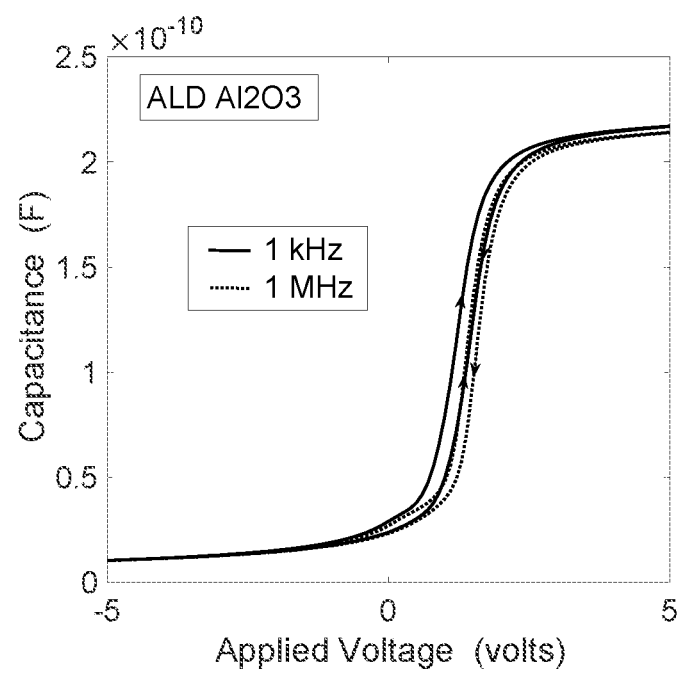
Figure 19:
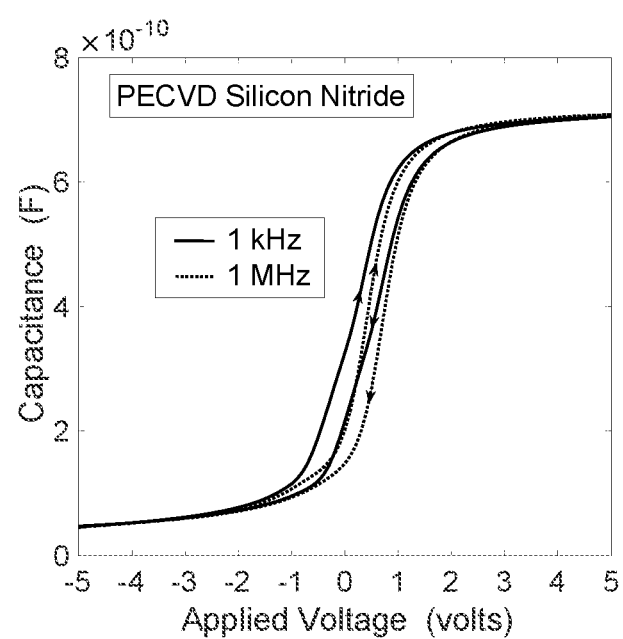

The last comparison of the dielectric deposition techniques was accomplished using capacitance-voltage (CV) behavior of the MIS contacts. The GaN was n-type doped with silicon to roughly $10^{16}$ cm$^{-3}$. For small area contacts, CV curves were taken on the MIS structures produced by each technique. FIG. 17 gives the CV curves on a LPCVD silicon nitride sample at measurement frequencies from 1 kHz to 1 MHz. FIG. 18 gives the CV curves on a ALD aluminum oxide sample at measurement frequencies from 1 kHz to 1 MHz. FIG. 19 gives the CV curves on a PECVD silicon nitride sample at measurement frequencies from 1 kHz to 1 MHz. There are 2 curves present for each frequency representing increasing DC bias and decreasing DC bias (bidirectional in voltage). These curves are displaced from each other at a given measurement frequency indicating a small amount of hysteresis originating from trapped charge in the MIS structure. The shift in the CV curve to higher voltages with increasing frequency is the response of an interface trap likely originating from hydrogen in the dielectric film [Ekedahl 1998]. Post deposition annealing in nitrogen is known to reduce this frequency related shift in MIS structures on GaN making the structure suitable for hydrogen sensing [Irokawa 2011]. All samples examined with an as-deposited dielectric film, regardless of deposition method, displayed a positive voltage frequency shift in the CV curve of less than 1 volt.

In strong forward bias, an accumulation charge develops in the GaN with a maximum volume concentration approaching $10^{20}$ cm$^{-3}$ near the dielectric/semiconductor interface making these structures suitable for accumulation/inversion mode transistor fabrication.

FIG. 19 illustrates bidirectional CV curves taken on PECVD MIS structure at measurement frequencies of 1 kHz and 1 MHz.

Each dielectric in a MIS structure is capable of producing strong accumulation (or inversion) of the semiconductor surface below the dielectric interface. The as deposited films had a voltage shift due to hysteresis at a 1 kHz measurement frequency of 0.7, 0.4 and 0.3 volts for the LPCVD dielectric, the PECVD dielectric, and the ALD dielectric, respectively. Similar structures using a silicon dioxide dielectric film with an underlying gallium oxide thin layer produced hysteresis at a 1 kHz of less than 2 mV [Yamada 2017]. This suggest that the hysteresis exist due to trapped charge at or near the interface. It should also be noted that large area MIS structures did not yield CV results on the ALS and PECVD films due to large shunting currents from pinholes.

In an example, the deposition is carried out at low pressure, referred to as LPCVD. In an example, the dielectric film is one of silicon nitride, aluminum silicon nitride, aluminum nitride, silicon oxynitride, gallium oxide, aluminum gallium oxide, magnesium oxide, magnesium silicon nitride, and aluminum oxide, among other compounds. In an example, dichlorosilane is used as the silicon precursor. In an example, ammonia used as the nitrogen precursor. In an example, trimethylaluminum used as the aluminum precursor. In an example, CP$_2$Mg used as the magnesium precursor. In an example, nitrous oxide is used as an oxygen precursor. In an example, silane or disilane is used as the silicon precursor. In an example, an ammonia anneal step of the GaN at temperatures greater than 700° C. occurs prior to the initiation of the dielectric deposition.

In an example, a silicon nitride dielectric is deposited on GaN with carbon volume concentrations of less than $10^{18}$ cm$^{-3}$ at the GaN/silicon nitride interface. In an example, a silicon nitride dielectric is deposited on GaN with oxygen volume concentrations of less than 2 ($10^{20}$) cm$^{-3}$ at the GaN/silicon nitride interface. In an example, a silicon nitride dielectric deposited on GaN with oxygen volume concentrations of less than $10^{19}$ cm$^{-3}$ in the silicon nitride film. In an example, a silicon nitride dielectric deposited on GaN which is annealed in nitrogen or oxygen or mixtures thereof to reduce the hydrogen content of the silicon nitride to less than 1% volume concentration.

In an example, a Metal-Insulator-Semiconductor (MIS) structure is fabricated with the present LPCVD dielectrics on GaN. In an example, a Metal-Insulator-Semiconductor (MIS) structure is fabricated with the present LPCVD dielectrics in combination with a thermal oxide on GaN. In an example, a Metal-Insulator-Semiconductor (MIS) structure is fabricated with the present LPCVD dielectrics in combination with a sputtered gallium oxide film on GaN.

Figure 20:
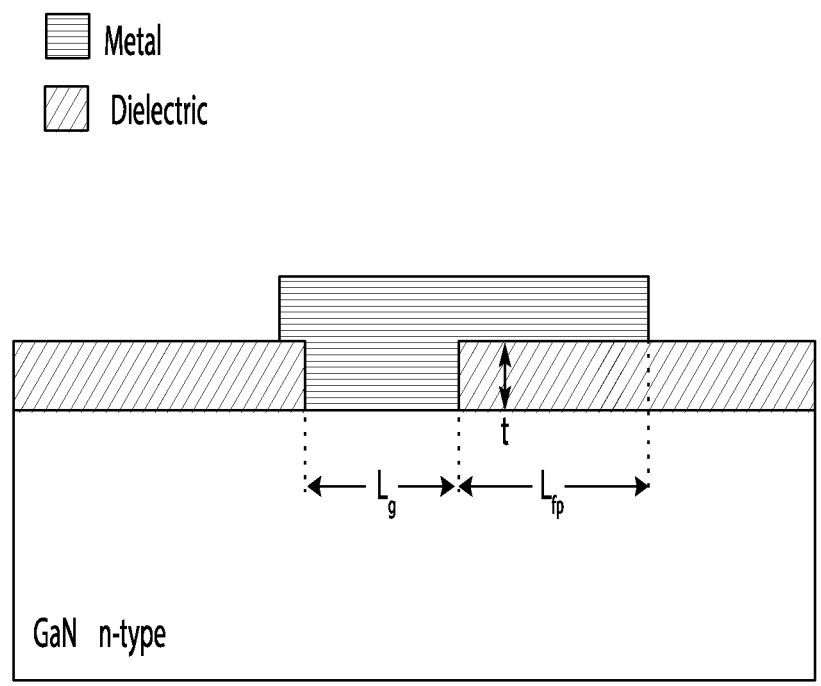
FIG. 20 illustrates a field plate structure overlying a dielectric material for a device according to an example of the present invention.

The above sequence of steps is used to form high voltage FET devices on a die from a substrate structure according to one or more embodiments of the present invention. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below. In an example, the device is also configured with a field plate. FIG. 20 illustrates a field plate structure overlying a dielectric material for a device according to an example of the present invention. The field plate is configured for high voltage application. In an example, a portion of the gate metal layer forms the field plate, which can overly a thickness of dielectric material in an isolation region. The thickness of the dielectric determines the height of the field plate, which can range from 100 nm to 1 micron, but can be others. In an example, the lateral dimension of the field plate is on the order of the epitaxial drift layer thickness, which can range 10 or 10 s of microns for a 1500 volt device. In a vertical FET device, the illustration applies to a gate electrode and a field plate that is vertically oriented. In an example, in the vertical FET device, field plate regions are configured on 1) the bottom of the etched fin sidewall, 2) between the etched fins on the bottom floor of the etched surface, and 3) on the device periphery outside the channel regions. Further variations, alternatives, and modifications can also exist, depending upon the example. References cited in the present specification are listed below.

[Stoffel 1996], Stoffel, et al., LPCVD against PECVD for micromechanical Applications. To cite this article: A Stoffel et al 1996 *J. Micromech. Microeng.* 6 1

[Tsuchiya 2008], Tsuchiya, Toshiyuki. (2008). 1.01. Silicon and Related Materials. Comprehensive Microsystems. 10.1016/B978-044452190-3.00002-1

[Reitmeier 2004], Reitmeier, et al, In situ cleaning of GaN (0001) surfaces in a metalorganic vapor phase epitaxy environment, Journal of Vacuum Science & Technology A 22, 2077 (2004); doi: 10.1116/1.1786309

[Ylivaara 2014], Ylivaara, et al., Aluminum oxide from trimethylaluminum and water by atomic layer deposition: The temperature dependence of residual stress, elastic modulus, hardness and adhesion, Thin Solid Films 552 (2014) 124-135

[Wang 2020], Wang, et al., Switching Performance Analysis of Vertical GaN FinFETs: Impact of Interfin Designs, IEEE JOURNAL OF EMERGING AND SELECTED TOPICS IN POWER ELECTRONICS, VOL. 9, NO. 2, April 2021, Page 2235

[Ekedahl 1998], Eriksson and Ekedahl, Hydrogen adsorption states at the Pd/SiO2 Interface and simulation of the response of a Pd metal-oxide-semiconductor hydrogen sensor, Journal of Applied Physics 83, 3947 (1998); doi: 10.1063/1.367150

[Irokawa 2011], Irokawa, et al, Ambient-hydrogen-induced changes in the characteristics of Pt/GaN Schottky diodes fabricated on bulk GaN substrates, Yoshihiro Irokawa et al 2021 *Jpn. J. Appl. Phys.* 60 068003

[Yamada 2017], Yamada, et al., Improved Interface properties of GaN-based metal oxide semiconductor devices with thin Ga-oxide Interlayers, Appl. Phys. Lett. 110, 261603 (2017); doi: 10.1063/1.4990689

While the above is a full description of the specific embodiments, various modifications, alternative constructions and equivalents may be used. As an example, the implanted gallium and nitrogen containing region can include any combination of elements described above, as well as outside of the present specification. As used herein, the term "substrate" can mean the bulk substrate or can include overlying growth structures such as a gallium and nitrogen containing epitaxial region, or functional regions, combinations, and the like. Therefore, the above description and illustrations should not be taken as limiting the scope of the present invention which is defined by the appended claims.

The invention claimed is:

1. A method for fabricating a high power FET device, the method comprising:
    providing a substrate comprising a first side and a second side, the first side comprising an n-type drift material, and overlying intrinsic gallium nitride material, and an n+ type gallium nitride contact material;
    forming a plurality of fingers comprising an entirety of a thickness of a portion of the n+ type gallium nitride contact material and a portion of the intrinsic gallium nitride material, each of the fingers extending into a predetermined thickness of the n-type drift material such than each of the fingers has a length greater than the entirety of the thickness of the n+ type gallium nitride contract material and the portion of the intrinsic gallium nitride material;
    causing exposure of a portion of the n-type drift material between a pair of the plurality of fingers;
    forming a high quality silicon nitride material having a carbon content with a volume concentration of less than $10^{18}$ cm$^{-3}$ overlying a surface of each of the plurality of fingers and exposed portions of the n-type drift material between each pair of the plurality of fingers;
    exposing a portion of the n+ type gallium and nitride contact material on each of the plurality of fingers;
    forming a contact region overlying the exposed portion of the n+ type gallium and nitride contact material on each of the plurality of fingers;
    forming an insulation region comprising a plurality of implanted species on each side of the plurality of fingers to a predetermined depth to withstand a predetermined voltage;
    forming a gate metal region between each of the plurality of fingers and along a sidewall of a pair of plurality of fingers;
    forming a planarized dielectric material overlying exposed surfaces of the gate metal region, plurality of fingers, isolation region, and contact region; and
    exposing the source contact region and a gate contact region from the gate metal region.

2. The method of claim 1 wherein n-type drift material, overlying intrinsic gallium nitride material, and then n+ type gallium nitride contract material are formed using an epitaxial growth process.

3. The method of claim 1 wherein the high quality silicon nitride material is deposited using a low pressure chemical vapor deposition process, and predetermined pressure.

4. The method of claim 3 wherein the high quality silicon nitride material forms a gate dielectric material.

5. The method of claim 1 wherein the contact region comprises a Ti/Al based ohmic contact on and in contact with the portion of the n+ type gallium and nitride contact material the Ti/Al based ohmic contact has been sintered using a controlled ambient process.

6. The method of claim 1 wherein the implanted species comprises a selected species having a predetermined concentration.

7. The method of claim 1 wherein the gate metal regions comprises a gate metal material configured using a lift off at an angle to coat each of the sidewalls to overlap a portion of the n+ type gallium nitride contract material.

8. The method of claim 1 wherein the planarized dielectric material is a thick field oxide material deposited by PECVD.

9. The method of claim 1 wherein the source contact region is made using a lift off process to expose a highly conductive material selected from Al, Cu, Au, or combinations thereof.

10. The method of claim 1 further comprising removing a thickness of a backside portion of the substrate using a thinning process to leave a thickness of about 25 to 100 μm.

11. The method of claim 10 further comprising cleaning surfaces of the substrate, and then forming a metal material overlying the backside portion using a low temperature <600° C. anneal for a time of predetermined seconds and less to form an ohmic contact after formation of the metal material.

12. The method of claim 11 further comprising singulating each device from a wafer.

13. A method for fabricating a high power FET device, the method comprising:
    providing a substrate comprising a first side and a second side, the first side comprising an n-type drift material, and overlying intrinsic gallium nitride material, and an n+ type gallium nitride contact material;
    forming a plurality of fingers comprising an entirety of a thickness of a portion of the n+ type gallium nitride contact material and a portion of the intrinsic gallium nitride material, each of the fingers extending into a predetermined thickness of the n-type drift material such than each of the fingers has a length greater than the entirety of the thickness of the n+ type gallium nitride contract material and the portion of the intrinsic gallium nitride material;
    causing exposure of a portion of the n-type drift material between a pair of the plurality of fingers;

forming a high quality silicon nitride material having a carbon species with a volume concentration of less than $10^{18}$ cm$^{-3}$. overlying a surface of each of the plurality of fingers and exposed portions of the n-type drift material between each pair of the plurality of fingers;

exposing a portion of the n+ type gallium and nitride contact material on each of the plurality of fingers;

forming a contact region overlying the exposed portion of the n+ type gallium and nitride contact material on each of the plurality of fingers;

forming an insulation region comprising a plurality of implanted species on each side of the plurality of fingers to a predetermined depth to withstand a predetermined voltage;

forming a gate metal region between each of the plurality of fingers and along a sidewall of a pair of plurality of fingers, forming a planarized dielectric material overlying exposed surfaces of the gate metal region, plurality of fingers, isolation region, and contact region;

exposing the source contact region and a gate contact region from the gate metal region;

removing a thickness of a backside portion of the substrate using a thinning process to leave a thickness of about 25 to 100 μm;

cleaning surfaces of the substrate, and then forming a metal material overlying the backside portion using a low temperature <600° C. anneal for a time of predetermined seconds and less to form an ohmic contact after formation of the metal material; and singulating each device from a wafer.

14. The method of claim 13 wherein n-type drift material, overlying intrinsic gallium nitride material, and then n+ type gallium nitride contract material are formed using an epitaxial growth process.

15. The method of claim 13 wherein the high quality silicon nitride material is deposited using a low pressure chemical vapor deposition process, and predetermined pressure.

16. The method of claim 15 wherein the high quality silicon nitride material forms a gate dielectric material.

17. The method of claim 13 wherein the contact region comprises a Ti/Al based ohmic contact on and in contact with the portion of the n+ type gallium and nitride contact material the Ti/Al based ohmic contact has been sintered using a controlled ambient process.

18. The method of claim 13 wherein the implanted species comprises a selected species having a predetermined concentration.

19. The method of claim 13 wherein the gate metal regions comprises a gate metal material configured using a lift off at an angle to coat each of the sidewalls to overlap a portion of the n+ type gallium nitride contract material.

20. The method of claim 13 wherein the planarized dielectric material is a thick field oxide material deposited by PECVD.

21. The method of claim 13 wherein the source contact region is made using a lift off process to expose a highly conductive material selected from Al, Cu, Au, or combinations thereof.

* * * * *